United States Patent [19]

Tobita

[11] Patent Number: 5,404,335
[45] Date of Patent: Apr. 4, 1995

[54] DYNAMIC TYPE SEMICONDUCTOR MEMORY DEVICE OPERABLE IN A SELF-REFRESHING MODE

[75] Inventor: Youichi Tobita, Hyogo, Japan

[73] Assignee: Mitsubishi Denki Kabushiki Kaisha, Tokyo, Japan

[21] Appl. No.: 39,661

[22] Filed: Mar. 30, 1993

[30] Foreign Application Priority Data

Apr. 1, 1992 [JP] Japan .................................. 4-078105

[51] Int. Cl.$^6$ .............................................. G11C 7/00
[52] U.S. Cl. .................................... 365/222; 365/193; 365/194; 365/195
[58] Field of Search ............................ 365/193–194, 365/195, 222

[56] References Cited

U.S. PATENT DOCUMENTS

| | | | |
|---|---|---|---|
| 4,344,157 | 8/1982 | White, Jr. et al. | 365/222 |
| 4,360,868 | 11/1982 | Retter | 364/200 |
| 4,368,514 | 1/1983 | Persaud et al. | 364/200 |
| 4,412,314 | 10/1983 | Proebsting | 365/222 |
| 4,787,067 | 11/1988 | Takemae et al. | 365/222 |
| 4,934,826 | 6/1990 | Miyatake et al. | 365/222 |
| 4,985,868 | 1/1991 | Nakano et al. | 365/193 X |
| 5,150,329 | 9/1992 | Hoshi | 365/222 |

FOREIGN PATENT DOCUMENTS 61-57097 3/1986 Japan .

*Primary Examiner*—Terrell W. Fears
*Assistant Examiner*—Christopher R. Glembocki
*Attorney, Agent, or Firm*—Lowe, Price, LeBlanc & Becker

[57] ABSTRACT

A dynamic type semiconductor memory device includes a CBR detecting circuit for detecting a timing condition of /CAS before /RAS, an RS flip-flop which is set depending on an output of the CBR detecting circuit, a pulse generating circuit which is activated in response to an output of the RS flip-flop and generates a one-shot pulse in response to the fall of the external row address strobe signal /RAS, a delay circuit which delays an output of the pulse generating circuit by a predetermined time period, an RS flip-flop which is set by an output of the delay circuit and is reset by the row address strobe signal /RAS, and a NOR circuit which receives outputs of the RS flip-flops, the row address strobe signal /RAS and the column address strobe signal /CAS and generates an internal CAS signal $\phi$CAS. In the dynamic type semiconductor memory device, which has a function of checking a refreshing counter for generating a refresh address and is operable in a self-refreshing mode, restriction on a timing condition of an external column address strobe signal /CAS is mitigated in the self-refreshing operation.

21 Claims, 12 Drawing Sheets

DYNAMIC TYPE SEMICONDUCTOR MEMORY DEVICE OPERABLE IN A SELF-REFRESHING MODE

BACKGROUND OF THE INVENTION

1. Field of the Invention

The present invention relates to a semiconductor memory device, and in particular to a dynamic type semiconductor memory device operable in a self-refreshing mode.

2. Description of the Background Art

As a type of semiconductor memory devices, there is a dynamic random access memory (referred to as "DRAM" hereinafter). The DRAM includes memory cells, each of which is formed of one transistor and one capacitor and occupies a small area, and has features that high density and high integration can be facilely achieved and cost per bit is low. Therefore, the DRAMs have been widely used as memory devices having large memory capacities.

The DRAM stores information in the form of electric charges in capacitors. Therefore, periodical refreshing of data in the memory cells is required. In a conventional refreshing method, a row address strobe signal /RAS in a pulse form is externally applied at a period of about 16 μs to a semiconductor memory device for refreshing the memory cell data. The row address strobe signal /RAS determines a memory cycle period of the semiconductor memory device, and also serves as a control signal which determines a timing for accepting a row address of the semiconductor memory device and a timing of an operation relating to row selection. This refreshing method is referred to as RAS only refreshing method, in which a row address is externally applied to designate a row and data of the memory cells connected to the row designated by this row address are refreshed.

A CMOS (Complementary Metal-Oxide Semiconductor) device used in the DRAM remarkably reduces power consumption and enables a battery-powered DRAM. The battery-powered DRAM is used, for example, in a portable personal computer. Battery-powered equipments such as portable personal computer use as power supplies batteries of relatively small capacities. For this reason, it is necessary to minimize the overall power consumption of a system in order to increase a battery life.

A self-refreshing mode is effective for minimizing the power consumption when only the information holding operation is carried out.

FIG. 10 is a timing chart for an external control signals in the self-refreshing mode. The self-refreshing mode is set by falling a column address strobe /CAS to "L" (at time t1) prior to fall of a row address strobe signal /RAS (at time t2). The column address strobe signal /CAS provides a timing for accepting a column address of the DRAM and a timing for controlling the column selecting operation, and further is used as a signal for determining timings for writing and reading data in a normal operation mode (during data read-/write operation).

In a self-refreshing mode, a self-refreshing control circuit provided in the DRAM automatically refreshes the memory cell data as long as both the signals /RAS and /CAS are set at "L".

In this self-refreshing mode, a refreshing address, which designates a row to be refreshed, is generated by an internal address counter, and also a refreshing timing is produced by an internal timer. Therefore, it is not necessary to utilize an external circuit such as an external DRAM controller for periodically applying pulse signals for determining the refreshing timing. For this reason, power consumption of the external refreshing control circuit such as DRAM controller is not required, and the overall power consumption of the system can be reduced.

The operation mode in which the refreshing is set by setting the signal /CAS at "L" before setting the signal /RAS at "L", as described above, is generally referred to as /CAS before /RAS refreshing operation (CBR refresh). When the signal /RAS falls to "L" at time t2, the refresh is carried out in accordance with the address generated by the refreshing address counter in the DRAM.

If a time period (tRASS) in which the signal /RAS is at "L" exceeds 100 μs, the DRAM carries out the refreshing in response to a refreshing request signal from the internal timer. As long as the signal /RAS is set at "L", the refreshing is repeated at a constant cycle period of, e.g., 125 μs.

The self-refreshing is completed by raising the signal /RAS to "H" at time t4.

FIG. 11 shows an overall construction of a DRAM having the self-refreshing function. In FIG. 11, the DRAM2 includes a memory cell array 100 having dynamic type memory cells disposed in a matrix of rows and columns, a row decoder 102 which decodes an internal row address signal RA to select a corresponding row in the memory cell array 100, a sense amplifier group 104 which senses and amplifies data of memory cells connected to the selected row in the memory cell array 100, a column decoder 106 which decodes an applied internal column address signal CA to generate a column selecting signal for selecting the corresponding column in the memory cell array 100, and an IO gate 108 which connects the selected column in the memory cell array 100 to an internal data line 110 in response to the column selecting signal supplied from the column decoder 106.

The sense amplifier group 104 includes sense amplifiers disposed correspondingly to the respective columns in the memory cell array 100. The DRAM further includes a multiplexer 112 which selectively allows passage of an externally applied address signal A and a refreshing address REFA supplied from an address counter 120, a row address buffer 114 which receives a signal from the multiplexer 112 to generate the internal row address signal RA, a column address buffer 116 which receives the externally applied address signal A to generate the internal column address signal CA, a refreshing control circuit 118 which receives the externally applied row address strobe signal /RAS and column address strobe signal /CAS and generates various control signals required for the refreshing when the refreshing mode is instructed, an RAS control signal generating circuit 122 which generates signals for controlling circuits related to the signal RAS in response to the row address strobe signal /RAS and the control signal supplied from the refreshing control circuit 118, and a CAS control signal generating circuit 124 which generates signals for controlling circuits related to the signal CAS in response to the column address strobe signal /CAS and the control signal supplied from the RAS control signal generating circuit 122.

The control signal supplied from the RAS control signal generating circuit 122 is applied to the row decoder 102 and row address buffer 114 to determine the operation timings of them, and also determines the operation timing of the sense amplifier group 104 (the signal path is not shown). The circuits related to the signal RAS include circuitry related to the row selection and circuitry related to the sensing operation. The control signal supplied from the CAS control signal generating circuit 124 determines the operation timings of the column decoder 106 and column address buffer 116, and also determines operations for externally writing and reading data, as will be described later. The CAS control signal generating circuit 124 is active while the RAS control signal generating circuit 122 is generating the internal RAS signal, and the DRAM is in the active state and is carrying out the row selecting operation.

The DRAM further includes a timer 126, which is activated in response to a refreshing instruction supplied from the refreshing control circuit 118 and generates the refreshing request signals at intervals of a predetermined time, an address counter 120 which carries out a counting operation under the control of the refreshing control circuit 118, a write control circuit 128, which generates the internal write signal for determining the data write timing in response to the control signal supplied from the CAS control signal generating circuit 124 and the externally applied write enable signal /WE, an input circuit 130 which produces internal write data from externally applied write data D and transmits the same to a selected memory cell in the memory cell array 100 in response to the internal write signal supplied from the write control circuit 128, and an output circuit 130 which produces external read data Q from the data of a selected memory cell in the memory cell array 100 in response to the control signal supplied from the CAS control signal generating circuit 124.

The write control circuit 128 produces the internal write signal in response to later one of the fallings of the column address strobe signal /CAS and write enable signal /WE. The output circuit 132 is activated in response to the fall of the column address strobe signal /CAS.

In FIG. 11, an address buffer 140 includes the row address buffer 114 and the column address buffer 116, of which address accepting timings are determined by the control signals supplied from the RAS control signal generating circuit 122 and the CAS control signal generating circuit 124, respectively. In these operations, the external address signal A may be formed of the row address signal and column address signal applied in a time-division multiplexed manner or may be in a non-multiplexed manner. The input circuit 130 and the output circuit 132 may carry out the input and output of data through separate pin terminals or common pin terminals. Then, an operation of the DRAM shown in FIG. 11 will be described below in brief.

In the normal operations for writing and reading of data, the multiplexer 112 applies the external address signal A to the row address buffer 114. When the row address strobe signal /RAS falls to "L", the DRAM is activated and the memory cycle starts. The RAS control signal generating circuit 122 generates the internal control signal to the row address buffer 114 in response to the fall of the signal /RAS. The row address buffer 114 responds to the applied control signal by producing an internal row address signal RA from the address signal A received through the multiplexer 112, to the row decoder 102. The row decoder 102 responds to the control signal applied from the RAS control signal generating circuit 122 by decoding the internal row address signal RA and selecting the corresponding row in the memory cell array 100. Then, the sense amplifier group 104 is activated by the control signal (not shown) applied from the RAS control signal generating circuit 122, and the data of the memory cells connected to the selected row is sensed, amplified and latched.

When the column address strobe signal /CAS falls to "L", the column address buffer 116 takes in the external address signal A and generates an internal column address signal CA under the control by the CAS control signal generating circuit 124. Then, the column decoder 106 decodes the internal column address signal CA to select a corresponding column in the memory cell array 100, and the selected column is connected through the IO gate 108 to the internal data line 110.

In the data writing operation, the write enable signal /WE is in the active state of "L", and the write control circuit 128 generates the internal write signal when the signal /CAS and the signal /WE both attain "L". The input circuit 130 produces an internal write data from an external write data D in accordance with the internal write signal supplied from the write control circuit 128. Thereby, the data is written in the memory cell located at the crossing of the column and row selected by the column decoder 106 and row decoder 102.

In the data read operation, the output circuit 132 produces an external read data Q from the data read to the internal data line 110 under the control by the CAS control signal generating circuit 124.

In the refreshing operation mode, the refreshing control circuit 118 is activated. When the refreshing control circuit 118 detects the designation of the self-refreshing mode in accordance with the combination of the states of the signals /RAS and /CAS, it applies a switching signal to the multiplexer 112 and enables the address counter 120. The address counter 120 in the normal operation mode latches the count.

The refreshing control circuit 118 also activates the timer 126, and applies a control signal to the RAS control signal generating circuit 122 for activating the RAS control signal generating circuit 122. Responsively, the RAS control signal generating circuit 122 generates the control signal, and the row address buffer 114 generates the internal row address signal RA from the refreshing address REFA received through the multiplexer 112 from the address counter 120, and applies the signal RA to the row decoder 102. The row decoder 102 decodes the internal row address signal RA produced from the refreshing address REFA to select a corresponding row in the memory cell array 100. The sense amplifier group 104 is activated under the control of the RAS control signal generating circuit 122 to sense and amplify the data of the memory cells connected to the selected row.

The operation of the CAS control signal generating circuit 124 is inhibited under the control of the RAS control signal generating circuit 122 even when the signal /CAS is set at "L". Thereby, the operations of the column address buffer 116, column decoder 106, write control circuit 128 and output circuit 132 are inhibited. The internal control signal supplied from the RAS control signal generating circuit 122 is maintained only for a predetermined period under the control of the refreshing control circuit 118, and all the control signals supplied from the RAS control signal generating circuit 122 are deactivated upon expiration of this refreshing period. Thereby, data of the memory cells which are sensed, amplified and latched by the sense amplifier group 104 are restored in the memory cells, and the DRAM returns to the precharge state.

Then, upon detection of the elapsing of the predetermined time period, the timer 126 applies the refreshing request signal to the refreshing control circuit 118. The refreshing control circuit 118 activates the RAS control signal generating circuit 122 again in response to the refreshing request signal. The count of the address counter 120 was incremented or decremented by one in response to a count instructing signal, which in turn was supplied from the RAS control signal generating circuit 122 when the last refreshing operation was completed. Therefore, in the current refreshing cycle, the address counter 120 generates the refreshing address REFA which designates the next row. In accordance with this refreshing address REFA, the row selecting operation and the refreshing of the data of the memory cells are carried out. Thereafter, the refreshing operations are carried out at intervals of the predetermined time period while the signals /RAS and /CAS are at "L". When the signal /RAS rises to "H", the refreshing control circuit 118 resets the timer 126 and sets the multiplexer 112 at the state for selecting the external address signal A. Also, the refreshing control circuit 118 sets the address counter 120 in the latch state after changing its count by one after the completion of the refreshing operation. Further, the refreshing control circuit 118 is released from the refreshing control operation by the rise of the signal /RAS to "H".

As described above, by continuously setting the signals /RAS and /CAS at "L" at the predetermined timing relationship, the data of the memory cells are automatically and internally refreshed.

FIG. 12 shows specific constructions of the refresh control circuit, RAS control signal generating circuit and CAS control signal generating circuit shown in FIG. 11. In FIG. 12, the refreshing control circuit 118 includes a CBR detecting circuit 1 which is responsive to the signals /RAS and /CAS to generate an internal refreshing instructing signal CBR indicating whether the self-refreshing mode is designated or not, a set/reset flip-flop (referred to merely as "RS flip-flop" hereinafter) 2 which is set in response to the signal CBR from the CBR detecting circuit 1 and is reset in accordance with the signal /RAS, a pulse generating circuit 3 which is activated by an output Q of the RS flip-flop 2 and generates a one-shot pulse in response to the signal /RAS, an OR circuit 4 which receives a refreshing request signal φREF from the timer 126 and the output of the pulse generating circuit 3, and a one-shot pulse generating circuit 5 which is responsive to the output of the OR circuit 4 to generate a one-shot pulse signal PU.

The CBR detecting circuit 1 includes an inverter circuit 12 for inverting the column address strobe signal /CAS, and an AND circuit 14 for receiving the output of the inverter circuit 12 and the row address strobe signal /RAS. The AND circuit 14 generates the signal at "H" when both the inputs attain "H" level. The RS flip-flop 2 goes to the set state in response to the rise of the internal refreshing mode instructing signal CBR to "H", and supplies the signal at "H" through its output Q. Also, the RS flip-flop 2 goes to the reset state in response to the rise of the signal /RAS to "H" and resets its output Q at "L". An output /Q of the RS flip-flop 2 is used as a control signal of the selecting operation of the multiplexer 112. The OR circuit 4 supplies a signal at "H" when one of the inputs attains "H". The one-shot pulse generating circuit 5 is responsive to the rise of the output signal from the OR circuit 4 to generate the pulse signals PU having a predetermined time width (a time width normally including a time period from the starting of a row selecting operation to the completion of the sense and latch operations of the sense amplifier).

The RAS control signal generating circuit 122 includes an NOR circuit 20 for receiving the row address strobe signal /RAS as well as the signal from the output Q of the RS flip-flop 2, an OR circuit 22 for receiving an output of the NOR circuit 20 and an output of the one-shot pulse generating circuit 5, and an RAS-related control circuit 24 which is responsive to the output of the OR circuit 22 to generate a signal for controlling the circuit related to the signal RAS. The NOR circuit generates the signal at "L" when at least one of the inputs attains "H".

The CAS control signal generating circuit 124 includes an RS flip-flop 32 which is set in response to the internal refreshing instructing signal CBR and is reset in response to the column address strobe signal /CAS, a three-input NOR circuit 34 which receives a signal CCE supplied from the output Q of the RS flip-flop 32 as well as the row address strobe signal /RAS and the column address strobe signal CAS, and a CAS-related control circuit 30 which is responsive to the output of the NOR circuit 34 to generate signals for controlling the circuit(s) related to the signal CAS.

Now, an operation of the self-refreshing control circuitry shown in FIG. 12 will be described with reference to FIG. 13 showing operation waveforms in the self-refreshing operation.

If the signals /RAS and /CAS are asserted at the timings along the /CAS before /RAS relationship, the signal CBR supplied from the CBR detecting circuit 1 rises to "H". The internal refreshing instructing signal CBR falls to "L" in response to the fall of the row address strobe signal /RAS. The RS flip-flop 2, which is set in response to the rise of the signal CBR, activates the timer 126 and inhibits the row selecting operation along the row address strobe signal /RAS through the NOR circuit 20.

Then, in response to the fall of the row address strobe signal /RAS, the output of the pulse generating circuit 3 rises and attains "H" for a predetermined time period, and the output of the OR circuit 4 rises to "H". The one-shot pulse generating circuit 5 responds to the output of the OR circuit 4 by generating the signal PU at "H" for a predetermined time period. Responsively, the OR circuit 22 generates an internal RAS signal φRAS, and the RAS-related control circuit 24 carries out the control operation relating to the row selection and the like in accordance with the internal RAS signal φRAS. During this operation, the outputs /Q of the RS flip-flop 2 are being applied to the multiplexer 112, and thereby the multiplexer 112 changes its connection path so as to apply the refreshing address supplied from the address counter 120 to the row address buffer 114.

Meanwhile, the RS flip-flop 32, which is set in response to the internal refreshing instructing signal CBR, supplies the output Q at "H", and the output of the NOR circuit 34 attains "L". While the output signal CCE supplied from the RS flip-flop 32 is at "H", the internal CAS signal φCAS is set at "L". Thereby, in the self-refreshing mode, the erroneous write and read of the data, which may be caused, e.g., by a noise on the control signal /CAS, is inhibited.

After the elapsing of the predetermined time period, the timer 126 generates the refreshing request signal φREF. Thereby, the internal RAS signal φRAS having the pulse width corresponding to the pulse signal PU is generated through the OR circuit 4, one-shot pulse generating circuit 5 and OR circuit 22, and the refreshing operation is carried out again. After the completion of the refreshing operation, the RAS-related control circuit 24 increments or decrements by one the count of the counter 120.

Thereafter, the refreshing is carried out each time the timer 126 generates the refreshing request signal φREF at the intervals of the predetermined time period.

When the row address strobe signal /RAS rises to "H", the RAS flip-flop 2 is reset and supplies the signal at the "L" level through its output Q. Thereby, the timer 126 is reset, and the multiplexer 112 goes to the state for selecting an external address. The counter 120 goes to the state for latching the count in accordance with the output of the RS flip-flop 2 (path for this is not shown in the figure).

When the signal /RAS rises, the self-refreshing may be under execution in accordance with the refreshing request signal φREF supplied from the timer 126, because it is impossible to externally determine the stage to which the self-refreshing proceeds. Even if the signal /RAS rises to "H", the self-refreshing is carried out in accordance with the internal RAS signal φRAS as far as the internal RAS signal φRAS is generated. For this reason, it is generally necessary to maintain the signal /RAS at "H" for a time period of at least one cycle, in a case that the signal /RAS is fallen to "L" for changing the self-refreshing mode to the normal operation mode.

The RS flip-flop 32 is provided for preventing the erroneous write and read of data, which may be caused by the generation of the internal CAS signal φCAS in the self-refreshing mode. The RS flip-flop 32 is not essential for merely preventing the generation of the internal signal φCAS. Application of signal of the output Q of the RS flip-flop 2 directly to the NOR circuit 34 may accomplish such prevention. Why RS flip-flop 32 which is reset in response to the column address strobe signal /CAS is provided and the signal /CAS is also applied to the NOR circuit 34 is as follows.

In the self-refreshing mode, the refreshing address counter 120 generates the refreshing address. For the periodical refreshing of the memory cells in each row in the memory cell array in the DRAM, it is necessary to operate the refreshing address counter correctly and to generate the refreshing address periodically. If refreshing address counter 120 is a ten-bit counter, the counter is required to generate the same refreshing address every 1024 cycles.

As one of test modes of the DRAM, there is a counter check operation for checking whether the refreshing address counter 120 operates correctly or not. Now, the counter check operation will be described with reference to an operation waveform diagram of FIG. 14.

As described above, the refreshing address counter 120 is a ten-bit counter. Initially, the data of, e.g., "1" is written into the DRAM, with the column address fixed and with the row address successively incremented by one. The write of data is carried out in accordance with the normal data write operation mode. Specifically, the write of data is carried out by falling the signal /CAS and the signal /WE after the fall of the signal /RAS.

Then, the data written in the respective bits in the 1024 rows is changed into the data "0". For this change, the operation shown in FIG. 14 is carried out. Specifically, the DRAM is set at the self-refreshing (CBR refreshing) mode along the /CAS before /RAS timing relationship. Thereby, the RS flip-flop 32 shown in FIG. 12 is set, and the signal CCE rises to "H". At time t2', the column address strobe signal /CAS rises to "H". Thereby, the circuit(s) (not shown) related to the signal /CAS (i.e., circuitry directly receiving the column address strobe signal /CAS) is initialized.

In response to the rise of the signal /CAS to "H", the RS flip-flop 32 is reset and the signal CCE falls to "L".

At time t2", the signal /CAS falls, and responsively the output signal φCAS of the NOR circuit 34 shown in FIG. 12 rises to "H", so that the CAS-related circuitry enters the operating state. This enables the write or read of data to the DRAM. FIG. 14 shows the operation waveform in an early write mode in which the write enable signal /WE falls to "L" prior to the fall of the column address strobe signal /CAS. In this case, the external address signal A is taken into the column address buffer 116 at time t2", and the internal column address signal CA is generated, so that the operation for selecting the column in the memory cell array is carried out. Before time t2", a row has been selected in accordance with the refreshing address REFA from the refreshing address counter.

At time t2", the column address is decided, and the write control circuit 128 shown in FIG. 11 is activated, so that the internal write signal is generated. Responsively, an input circuit 130 accepts the external write data D of "0", and produces the internal write data which is transmitted to the internal data line 110. Thereby, the data is written in the memory cell located at the crossing of the row designated by the refreshing address and the column designated by the external column address signal. The operation shown in FIG. 14 is repeated 1024 times. Thereby, the data of all the memory cells of the same column in the 1024 rows (i.e., of the column address same as the column address used for the write of "1") changes to "0".

Then, the DRAM is set in the self-refreshing mode along the timing relationship of the /CAS before /RAS again, and the counter 120 is set in the operating state. The signal /CAS is raised to "H" again, and then is fallen, to "L" at the time t2". In this operation, the signal /WE is set at "H", whereby the data is read from the column corresponding to the applied external address in response to the fall of the column address strobe signal /CAS. This read operation is similarly repeated 1024 times. If all the data thus read is "0", it is determined that the address counter 120 operates correctly.

The refreshing address counter 120 is operated 1024 times because the initial value of the refreshing address counter 120 is set at an arbitrary value in a dummy cycle carried out upon initialization of DRAM.

The pulse signal PU generated from the one-shot pulse generating circuit 5 in the self-refreshing mode is made to have a time length nearly equal to the cycle time required for the normal write and read of the data. In a case of the CBR refreshing carrying out only one refreshing operation (in which only the refreshing address counter is used without using the timer), the duration in which the signal /RAS is at "L" is set at up to about 10 μs. The maximum duration for the active state of the signal /RAS in one cycle period is determined so as to prevent the reduction of the word line potential, which may be caused by leak and may impair correct write/read of data.

As described above, the self-refreshing mode enables the refreshing to be internally executed by the DRAM without an operation of an external control circuit of the DRAM, so that the power consumption of the system can be reduced.

The self-refreshing mode is set, as shown in FIG. 10, by falling the signal /CAS to "L" at time t1 and then falling the signal /RAS to "L". When the duration tRASS of the "L" state of the signal /RAS equals 100 µs or more, the internal refreshing is executed under the control of the timer.

In order to return from the operation in the self-refreshing mode to the normal operation mode, both the signals /RAS and /CAS must be raised to "H", because all the circuits related to the signals RAS and CAS must be brought to the precharge state. For the restoration to the initial state, specification values for various signals such as a set-up time and a hold time are generally determined in order to ensure the correct memory operation by the precharge of a signal line and correct determination of the signal state.

The column address strobe signal /CAS generally rises to "H" after the rise of the row address strobe signal /RAS. However, as shown in FIG. 10, it is permitted that the column address strobe signal /CAS may rise to "H" prior to rise of the signal /RAS. In this case, however, it is required to set a CAS preceding time tCHS at 50 ns or less for ensuring the correct operation in DRAM specification.

The time difference tCHS of 50ns or less between the times t3 and t4 is extremely shorter than the duration tRASS of 100 µs in which the signal /RAS maintains "L" in the self-refreshing mode. Therefore, the above condition requires extremely severe restriction on the timing design of the memory system. As a method for mitigating the condition requiring 50 ns or less, it may be envisaged that the "L" state of the column address strobe signal /CAS is latched at the time (t2) of the fall of the row address strobe signal /RAS and this latch state is reset by the signal /RAS.

For this purpose, for example, a latch circuit which is activated in response to the signal CBR and latches the signal /CAS in response to the row address strobe signal /RAS can be provided, and the output of this latch circuit can be used in place of the column address strobe signal /CAS shown in FIG. 12. In this case, when the signal CBR or the signal /RAS is inactive, this latch circuit must attain a through state for allowing passage of the column address strobe signal /CAS as received. However, if such latch circuit is used, the internal signal CAS is reset by the external signal /RAS, so that the counter check operation, which has been described with reference to FIG. 14, cannot be executed.

Therefore, such latch circuit cannot be used if the counter check function is required.

On the other hand, if the condition that the CAS preceding time tCHS is 50 ns or less is not satisfied, following disadvantages may be caused. In the self-refreshing mode, if the signal /RAS is in the "L" state for 100 µs, the timer operates to generate the refreshing request $\phi$REF. In this case, however, an operating margin has been taken into account, and thus the timer may be activated even when the row address strobe signal /RAS maintains "L" for 90 µs.

Now, consideration will be made on a state that the timer generates the refreshing request signal $\phi$REF if the signal /RAS maintains "L" for 90 µs in the DRAM, as shown in FIG. 15. It is assumed that, in the self-refreshing operation mode, the column address strobe signal /CAS rises to "H" at time t2' and then falls to "L" at time tA. In this state, the DRAM generates the internal RAS signal $\phi$RAS, and the row selection and the refreshing operation are carried out in the DRAM array. In this state, when the signal /CAS falls to "L" at time tA, the column selecting operation is carried out in accordance with the external address signal and the data is written in or read from the selected memory cells. In FIG. 15, data in a "don't care" state is regarded as a valid data Da.

In general, erroneous write and read of data into and from the memory cells which are being refreshed are prevented by inhibiting generation of the internal CAS signal $\phi$CAS in the self-refreshing operation mode. However, if the counter check function is provided, the internal CAS signal $\phi$CAS is generated in accordance with the externally applied column address strobe signal /CAS, so that the write or read of data is carried out during the self-refreshing operations.

In general, since it is impossible to externally recognize the progress state of the refreshing in the self-refreshing operation mode, the self-refreshing mode is generally used in the standby state and is carried out only for the data holding. Therefore, the external signals are preferably maintained at a fixed state in view of the low power consumption.

However, depending on the actual conditions of practical use, the external column address strobe signal /CAS may temporarily rise to "H" and then fall to "L". Therefore, it is preferable to provide means for preventing erroneous write and read of data in the self-refreshing mode for mitigating the restriction on the use of the DRAM.

In the design of the timing of the system, it is preferable to prevent erroneous write and read of data and to minimize the restriction on the preceding time tCHS of the column address strobe signal /CAS in the self-refreshing mode. In other words, the time duration of "don't care" state of the signal /CAS should be made as long as possible in view of a timing design and usability, as shown in FIG. 16.

SUMMARY OF THE INVENTION

An object of the invention is to provide a dynamic type semiconductor memory device having less restriction on a timing related to a column address strobe signal in a self-refreshing operation.

Another object of the invention is to provide a dynamic type semiconductor memory device in which malfunction in a self-refreshing mode of operation can be surely prevented without imposing severe timing conditions on the device.

Still another object of the invention is to provide a dynamic type semiconductor memory device in which timings of a memory system can be facilely designed.

Yet another object of the invention is to provide a dynamic type semiconductor memory device in which restriction on a signal timing in a self-refreshing mode can be mitigated without impairing a refreshing counter check function.

A semiconductor memory device according to the invention includes circuitry for generating an internal self-refreshing instructing signal in response to a self-refreshing operation mode instructing signal, delay circuitry for delaying a memory cycle start instructing signal by a predetermined time period in response to the internal self-refreshing instructing signal, and circuitry for inhibiting writing of data in the semiconductor memory device in response to an output of the delay circuitry.

In the semiconductor memory device according to the invention, the semiconductor memory device is inhibited from writing data by the output of the delay circuitry after the elapsing of the predetermined time period in the self-refreshing operation mode, so that write and read of the data is not carried out in the self-refreshing operation mode even if the column address strobe signal /CAS changes. After the elapsing of the predetermined time period, circuitry related to the internal signal CAS does not operate even if the external column address strobe signal changes, so that a timing condition, which is required for the column address strobe signal /CAS when the self-refreshing operation mode is released, is mitigated.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
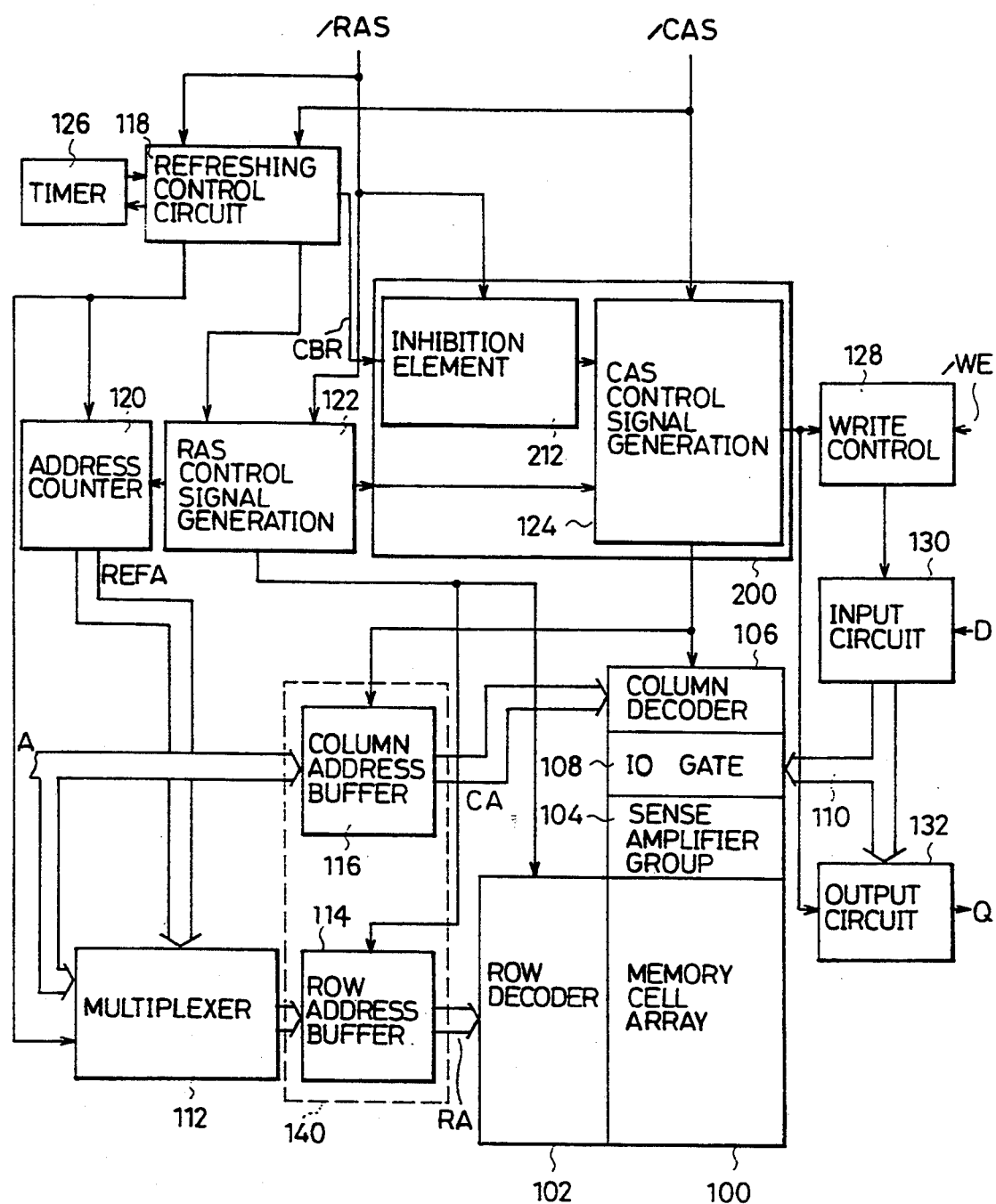
FIG. 1 shows an overall construction of a semiconductor memory device according to an embodiment of the present invention.
Figure 11:
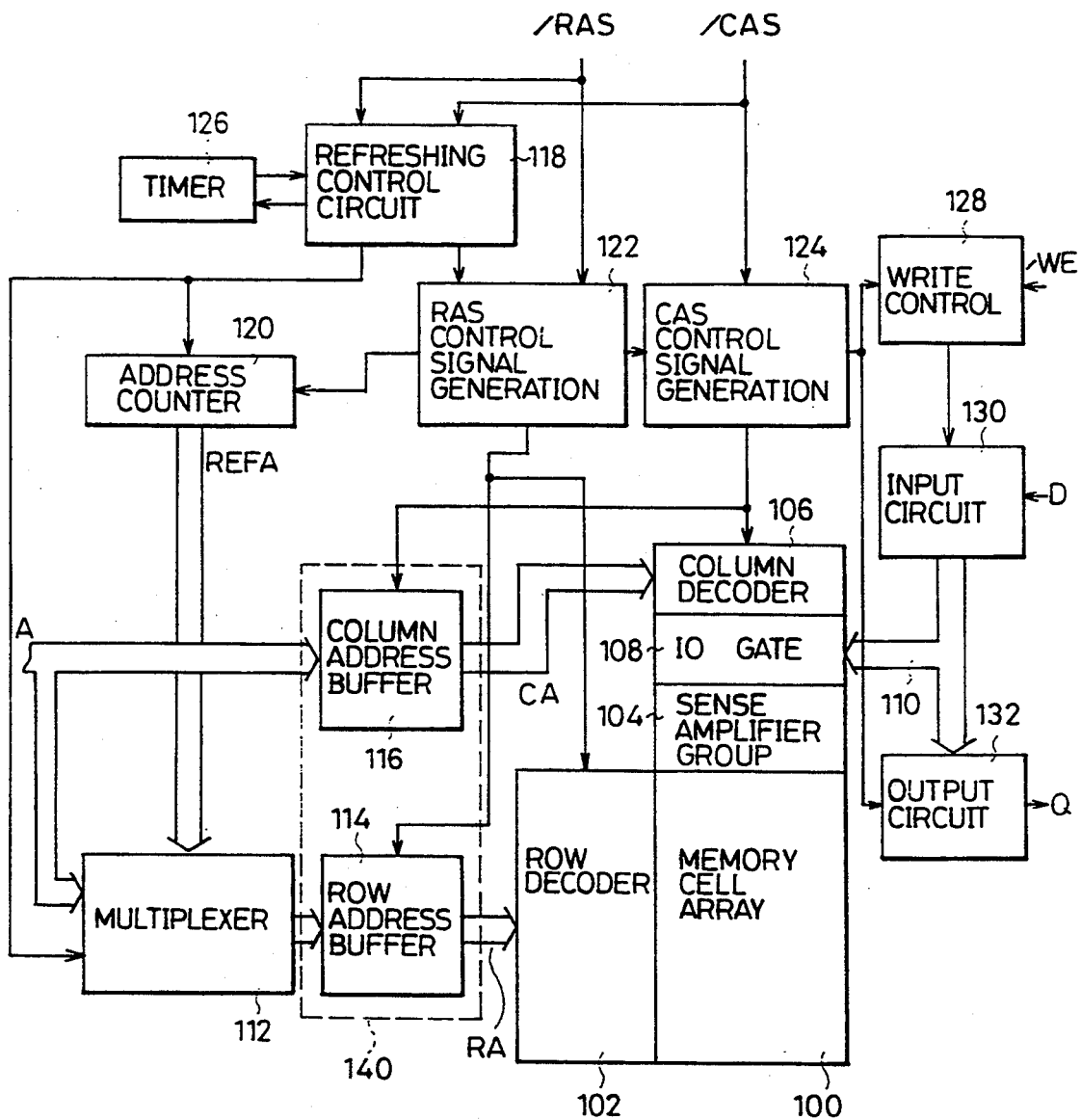
FIG. 11 shows an overall construction of a dynamic type semiconductor memory device operable in a self-refreshing mode in the prior art.

Referring to FIG. 1, a semiconductor memory device of the present invention includes a CAS control circuit 200 which includes CAS control signal generation circuit 124 similar to the circuit 124 shown in FIG. 11 and an inhibition element 212 responsive to the signals CBR and /RAS for inhibiting an operation of CAS control signal generating circuit 124 for a predetermined time. Other shown components are similar to those shown in FIG. 11. Like reference numerals denote like components.

Figure 16:
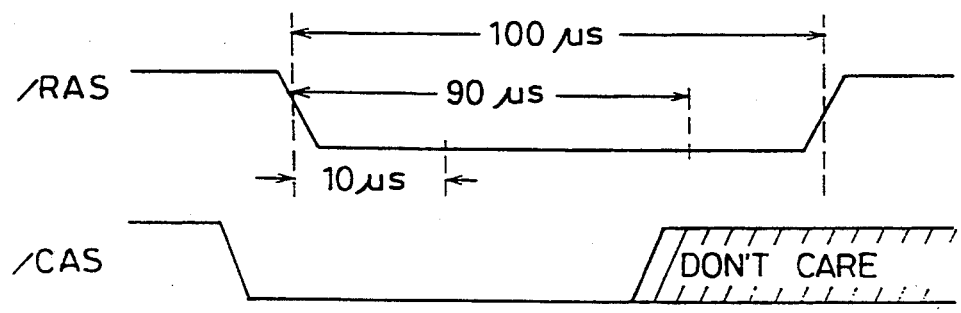
FIG. 16 shows a preferable condition of a signal /CAS intended by the present invention.

Inhibition element 212 delays the signal /RAS by a predetermined time, and inhibits the circuit 124 from generating internal CAS signal ϕCAS in response to the delayed signal. A period in which the signal /CAS can be stayed in the don't care state can be reliably made longer to implement the mitigated condition on the signal /CAS as shown in FIG. 16.

In FIG. 2, the CAS control circuit 200 includes the RS flip-flop 32 which is set in response to the internal self-refreshing instructing signal CBR supplied from the CBR detecting circuit 1 and is reset in response to the column address strobe signal /CAS, a pulse generating circuit 48 which is activated in response to the control signal CCE supplied from the output Q of the RS flip-flop 32 and generates a one-shot pulse signal RAS' having a predetermined time width in response to the fall of the external row address strobe signal /RAS, a delay circuit 44 which delays the pulse signal RAS' supplied from the pulse generating circuit 48 a predetermined time (e.g., of about 90 μs or about 99 μs), an RS flip-flop 47 which is set in response to the output of the delay circuit 44 and is reset in response to the rise of the external row address strobe signal /RAS, and a four-input NOR circuit 45 which receives the column address strobe signal /CAS, the control signal CCE, a control signal T supplied from the output Q of the RS flip-flop 47 and the external row address strobe signal /RAS. The pulse generating circuit 48 includes a delay element 250 for delaying the signal /RAS by a predetermined time, NAND gate receiving an output of the delay element 250 and the signal /RAS, and AND gate 254 receiving the signal CCE and an output of NAND gate 250. NAND gate 252 generates a pulse signal in response to the fall of the signal /RAS. AND gate 254 passes the pulse signal from NAND gate 250 to generate the pulse signal RAS' when the signal CCE is "H".

The NOR circuit 45 generates the internal CAS signal ϕCAS, which is applied to the CAS-related control circuit 36. The circuits 44 and 48 and the flip-flop 47 constitute the inhibition element 212, while the flip-flop 32, gate 45 and the circuit 45 constitute the CAS control signal generating circuit 124. Now, an operation of the CAS control signal generating circuit shown in FIGS. 2A and 2B will be described with reference to an operation waveform diagram of FIG. 3.

At time t1, the external column address strobe signal /CAS falls to "L", and then, at time t2, the external row address strobe signal /RAS attains "L". In response to the fall of the column address strobe signal /CAS to "L" at the time t1, the internal self-refreshing instructing signal CBR supplied from the CBR detecting circuit 1 rises to "H", to set RS flip-flop 32. Responsively, the signal CCE supplied from the output Q of the RS flip-flop 32 rises to "H", and the pulse generating circuit 48 is activated.

At time t2, the external-row address strobe signal /RAS falls to "L", and the pulse generating circuit 48 generates the pulse signal RAS' having a predetermined time width. The pulse width of the pulse signal RAS' may be shorter than one cycle required for the ordinary refreshing, and is required only to have the width enough to set the RS flip-flop 47. The delay circuit 44 delays the pulse signal RAS' by the predetermined time period and applies it to the set input S of the RS flip-flop 47.

While the control signal CCE is at "H", the output signal $\phi$CAS of the NOR circuit 45 is at "L", so that the CAS-related control circuit 36 does not generate a control signal, and the column selecting operation and the operations for writing and reading a data are inhibited. After the elapsing of the predetermined time period, the output of the delay circuit 44 rises at time tT, and the RS flip-flop 47 is set. Thereby, the control signal T rises to "H".

Now, it is assumed that the column address strobe signal /CAS temporarily rises to "H" at time t2'. In response to this rise of the signal /CAS, the RS flip-flop 32 is reset, and the control signal CCE attains "L". In this state, since the control signal T is at "H", the output signal $\phi$CAS of the NOR circuit 45 is still at "L".

Even if the column address strobe signal /CAS falls to "L" at time t2" and thereafter rises to "H" at time t3, the internal CAS signal $\phi$CAS is maintained at "L" through the function of the NOR circuit 45 because the control signal T is at "H".

Therefore, even if the control signal /CAS erroneously rises once to "H", then falls to "L" and thereafter rises to "H" again in the self-refreshing mode of operation, as described above, the write and read of data are not carried out at all because the internal CAS signal $\phi$CAS maintains "L".

In this case, even if the timer requests the refreshing at time t3, taking the operating margin of the internal refreshing timer into account, the refreshing operation is surely carried out without being adversely affected, because the signal T is at "H°" in this state and thus operations such as column selecting operation are inhibited.

At time t4, when the external row address strobe signal /RAS rises to "H", to reset RS flip-flop 47, the control signal T falls to "L". Thus, the internal operations for writing and reading data and for selecting a column are inhibited during a time period between the times tT and t4 (i.e., while the signal T is at "H") even if the signal /CAS changes, and thus malfunction can be surely prevented. As long as the signal T is at "H", the signal /CAS can be said to be in the don't case state.

In general, the time period between the times t2 and t4 is determined to be 100 $\mu$s in accordance with the specification. In this case, it is necessary to envisage such a state where the refreshing timer requests the refreshing prior to the elapsing of 100 $\mu$s, taking the operating margin into account. In this case, if the delay time period between the times t2 and T provided by the delay circuit 44 is set at about 90 $\mu$s, the time period between the times tT and t4 can be set at about 10 $\mu$s. The internal CAS signal $\phi$CAS rises to "H" when all the input signals of the NOR circuit 45 attain "L". So, even if the signal /CAS is raised to "H" prior to the signal /RAS, the internal CAS signal $\phi$CAS has already been at the "L" state by the signal T. Therefore, the externally applied column address strobe signal /CAS can be set at "H" at an arbitrary time point during this time period, and thus the timing condition on the signal /CAS can be significantly mitigated, as compared with the conventional condition in which the preceding time period tCHS is 50 ns, which facilitates the system design.

When the counter check operation is carried out, the cycle time is generally up to about 10 $\mu$s, and the signal /CAS rises to "H" at or before time tT. In this state, since the signal T is at "L", the internal CAS signal $\phi$CAS is generated in accordance with the externally applied column address strobe signal /CAS to allow the write and read of data, as shown in the dotted waveforms in FIG. 3.

Figure 4:
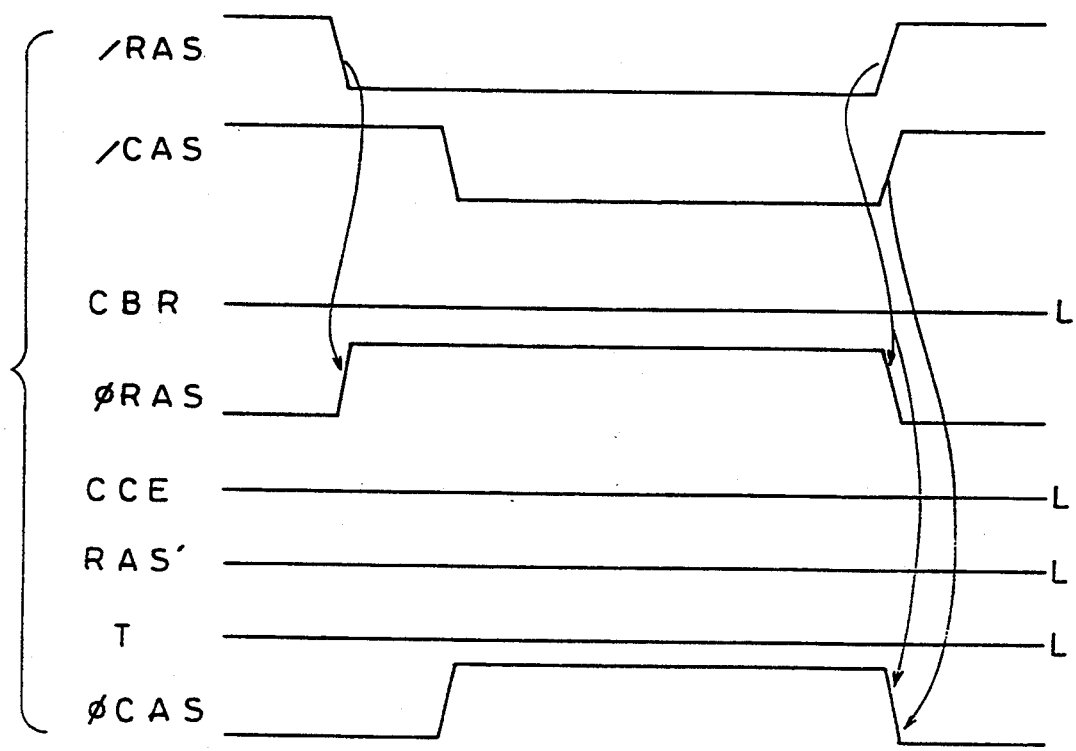
FIG. 4 is a waveform diagram showing an operation of the circuitry shown in FIG. 4 in a normal operation mode.

In a normal operation of reading and writing data, the signal /RAS falls to "L", and then the signal /CAS falls to "L" as shown in FIG. 4. The signal CBR is not generated, and the signals CCE and T are maintained at "L". Internal signals $\phi$RAS and $\phi$CAS are generated in response to the signals /RAS and /CAS, respectively. No adverse effect on the normal operation is exerted by the inhibition element 212.

In the foregoing embodiments, it has been discussed that the delay time period (i.e., period between times t2 and tT) provided by the delay circuit 44 is about 90 $\mu$s. However, this time period is required only to be set depending on the admissible margin to the timing at which the refreshing timer generates the refreshing request signal, and may be set, for example, at 99 $\mu$s. Even if the delay time period is 99 $\mu$s, the time period from the time tT to the time t4 is about 1 $\mu$s, which is sufficiently larger than the conventional value of 50 ns, so that the timing condition on the external column address strobe signal /CAS can be sufficiently mitigated.

In the foregoing embodiments, constructions of the refreshing control circuit and RAS-related control signal generating circuit have not been described in detail. However, these constructions are similar to the conventional circuit constructions, and may employ the circuit constructions shown in FIG. 12 or the other circuit constructions, conditioned that the circuit constructions carry out the self-refreshing in the self-refreshing mode designated at the timing relationship of the /CAS before /RAS.

Figure 5:
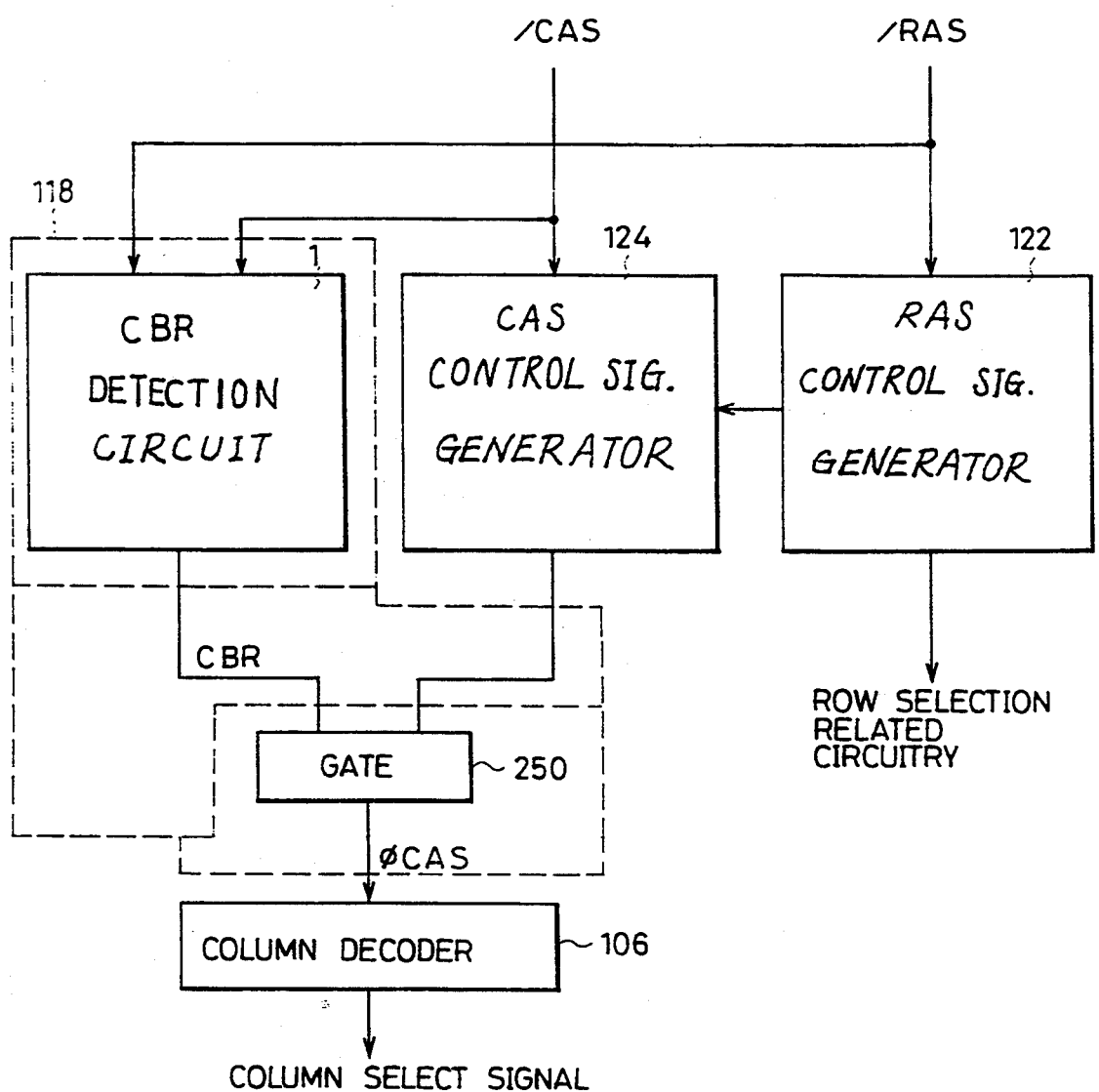
FIG. 5 shows another embodiment of the present invention.

FIG. 5 depicts a second embodiment of the present invention. In FIG. 5, a logic gate 250 inhibits the transfer of the internal CAS signal $\phi$CAS to the column decoder 106, after the elapse of a predetermined time when the refresh instructing signal CBR from CBR detection circuit 1. In this arrangement, the input circuit 130 or the output circuit 132 may be activated. What is important is to prevent destruction of data stored in the memory cells during the refreshing. When the column decoder 106 is not operated, ho column of the memory cell array 100 is coupled to the input circuit 130 or the output circuit 132 because IO gate 108 is closed. The arrangement of FIG. 5 provides the same effect as the construction of FIGS. 2A and 2B.

Figure 6:
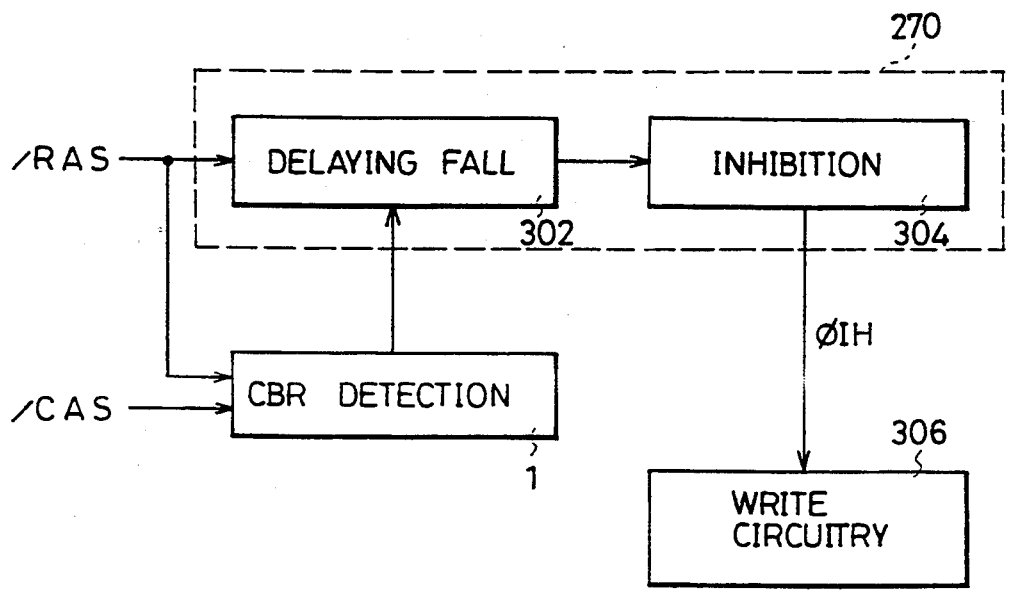
FIG. 6 shows a functional construction of an inhibition element shown in FIG. 1.

FIG. 6 shows a further embodiment of the present invention. In FIG. 6 an inhibition element 270 includes a delaying fall circuit 302 for delaying only the falling of the signal /RAS, and an inhibition circuit 304 for generating an inhibiting signal $\phi$IH in response to an output of the delaying fall circuit 302, to inhibit an operation of write circuitry 306. The write circuitry 306 may include both the write control circuit 128 and the input circuit 130, or may include one of them. In this arrangement, internal write data is not generated, so that no destruction of memory cell data is caused, as far as an internal data bus between IO gate 108 and input circuit 130 is maintained at an electrically floating state.

Figure 7A:
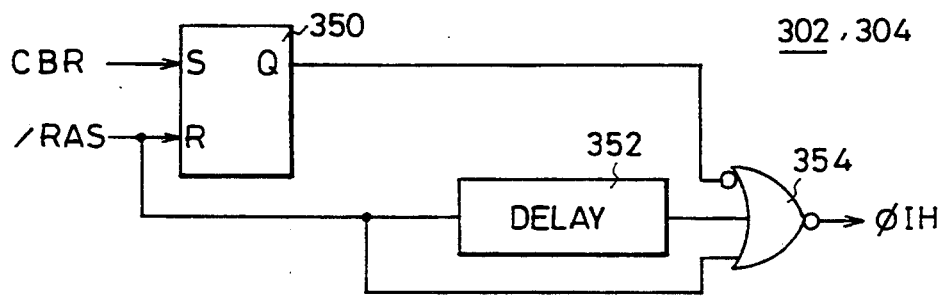
FIG. 7A shows a specific construction of a delaying fall circuit shown in FIG. 6.

Referring to FIG. 7A, the delaying fall circuit 302 includes an RS flip-flop 350 receiving the signal CBR at a set input S and the signal /RAS at a reset input R, a delay element 352 for delaying the signal /RAS by a predetermined time, and a gate circuit 354 receiving an output Q of RS flip-flop 354, an output of delay element 352 and the signal /RAS.

Figure 7B:
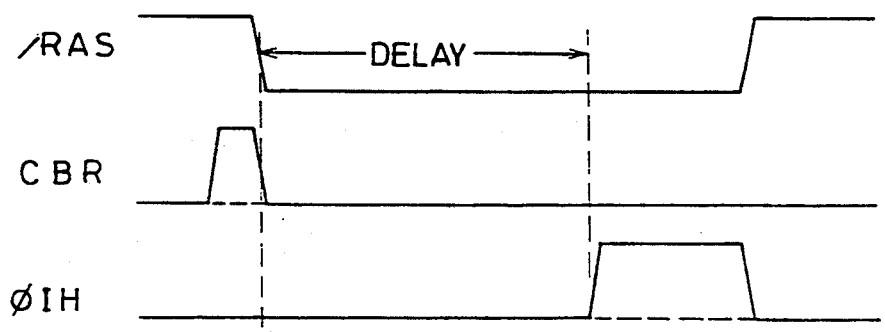
FIG. 7B is a waveform diagram showing an operation of the circuit shown in FIG. 7A.

Gate circuit 354 serves as a NOR gate when the Q output of RS flip-flop 350 is at "H". Gate circuit 354 fixes the output signal $\phi$IH at "L" when Q output of RS flip-flop 350 is at "L". Now, operation of the circuit 302 will be described with reference to FIG. 7B.

When CBR condition is established, the signal CBR is generated to set RS flip-flop 350. Q output of RS flip-flop 350 rises to "H". When the signal /RAS falls to "L", an output of delay element 352 is at "H" yet. So, the inhibition signal $\phi$IH is at "L". When the predetermined time has passed, the output of delay element 352 rises to "H", to raise the inhibition signal $\phi$IH to "H". Then, the write circuitry 306 is disabled. The signal /CAS can take any state. When the signal /RAS rises to "H", the inhibition signal $\phi$IH is fallen to "L", and RS flip-flop 350 is reset.

Figure 8:
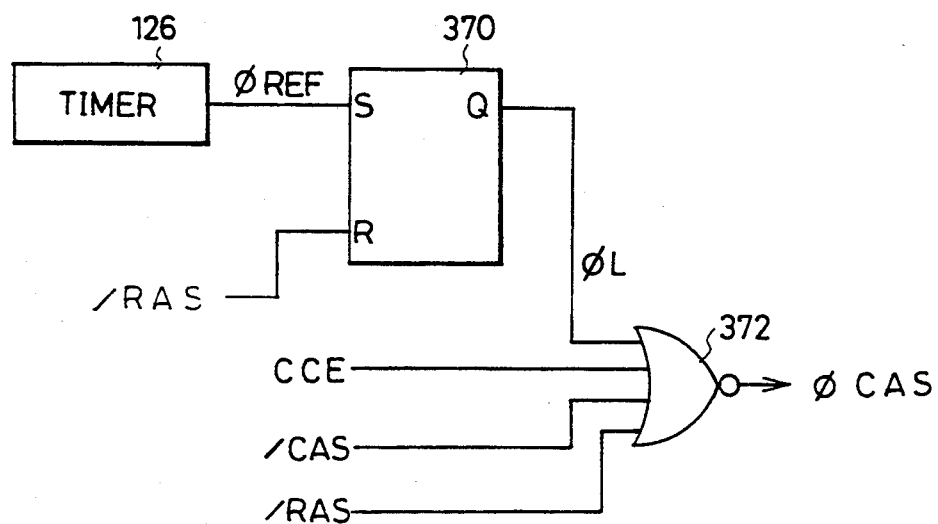
FIG. 8 shows further embodiment of the present invention.

FIG. 8 shows a further another embodiment of the present invention. In the embodiment of FIG. 8, the timer 126 for generating the refresh request signal $\phi$REF is used. RS flip-flop 370 is set by the refresh request signal $\phi$REF, and is reset in response to the rise of the signal /RAS.

Figure 2A:
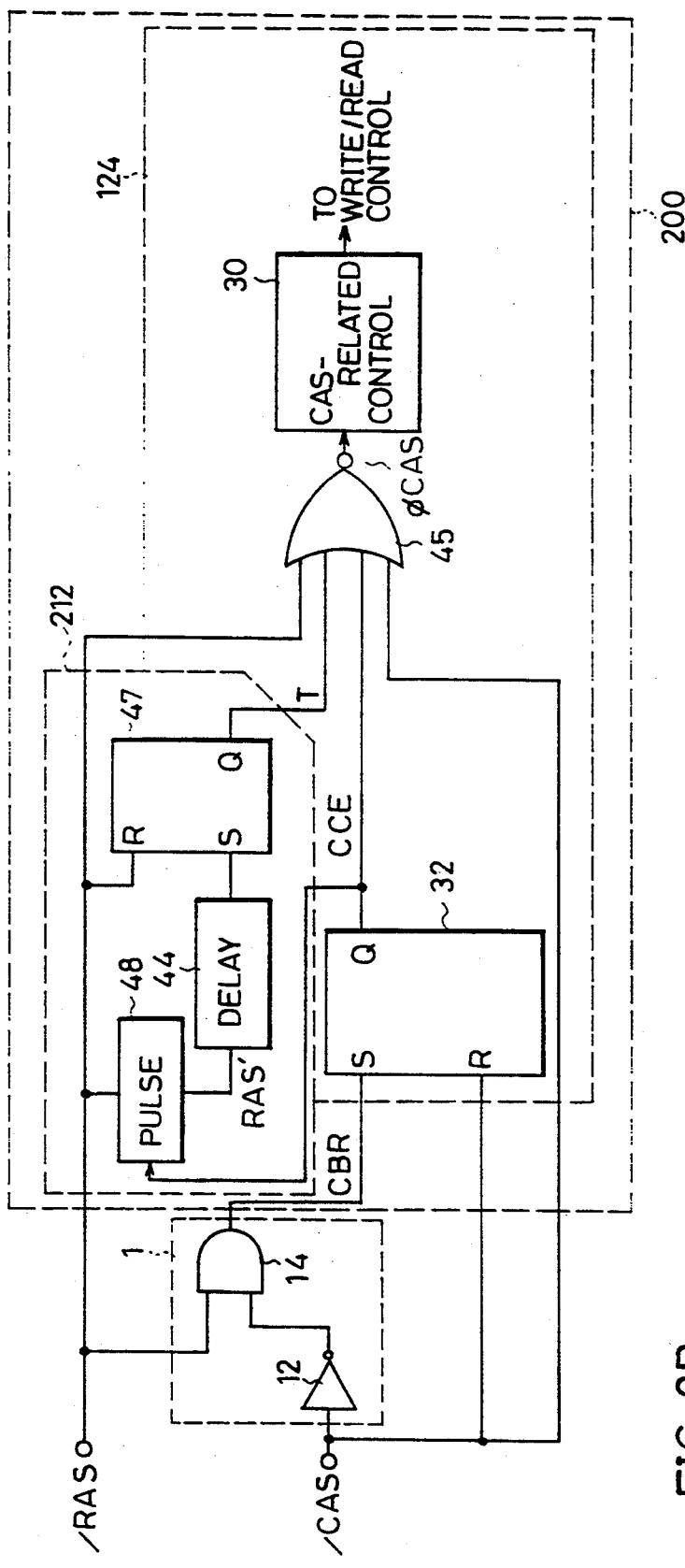
FIG. 2A–B show a construction of a CAS control signal generating circuit according to an embodiment of the invention.
Figure 2B:
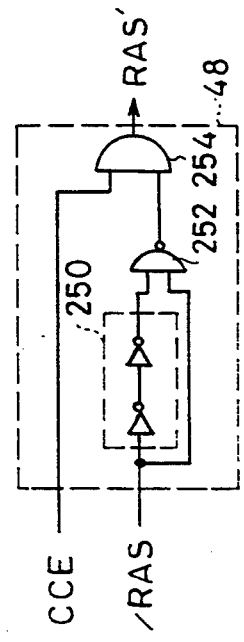
Figure 3:
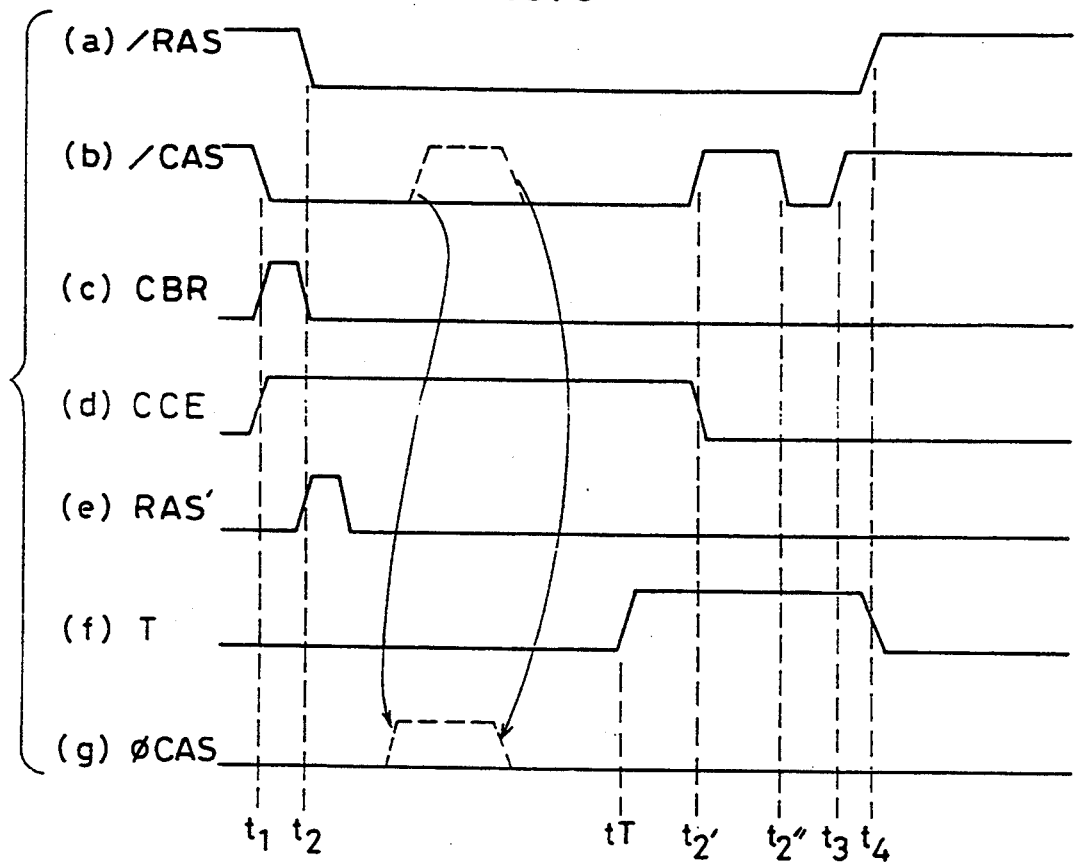
FIG. 3 is a signal waveform diagram showing an operation of a circuit shown in FIG. 4.
Figure 9:
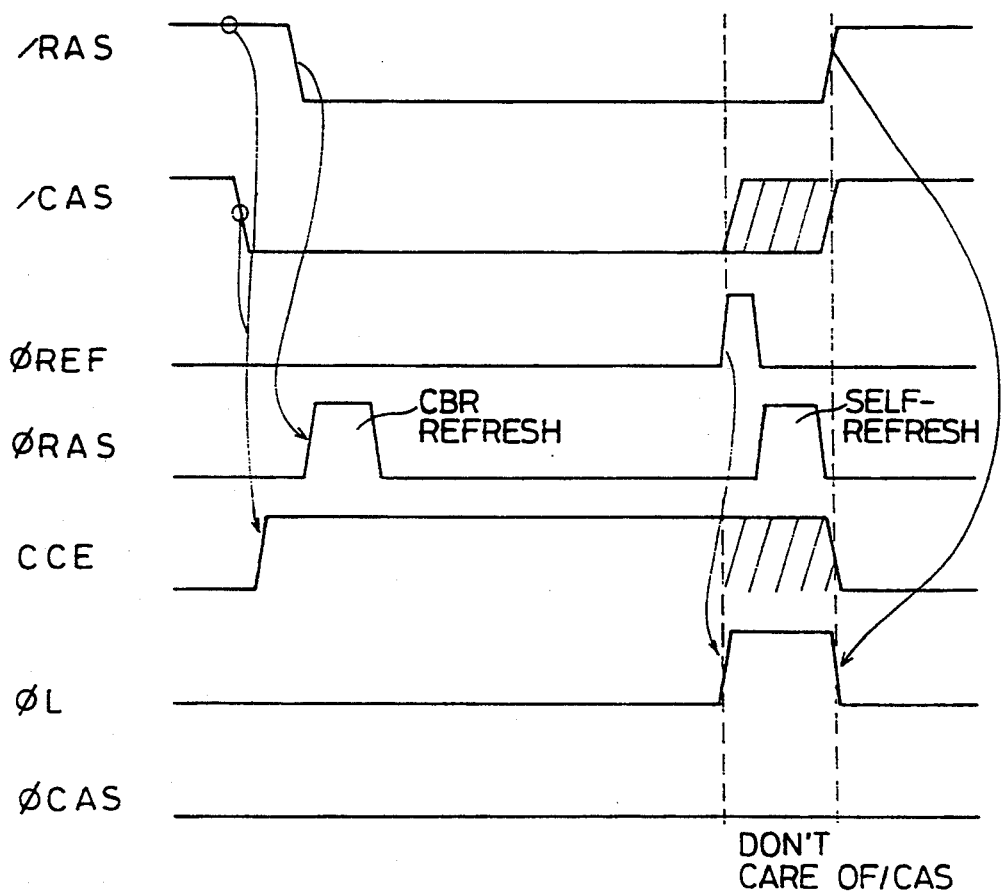
FIG. 9 is a waveform diagram showing an operation of the circuit shown in FIG. 8.
Figure 10:
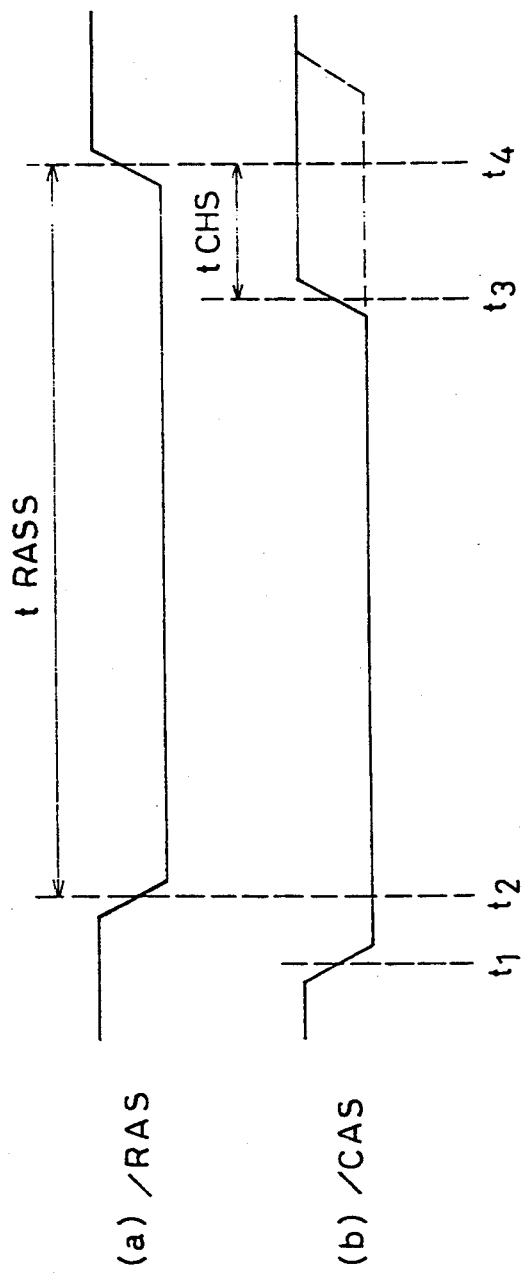
FIG. 10 is a waveform diagram showing a timing of an external control signal in a self-refreshing mode.
Figure 12:
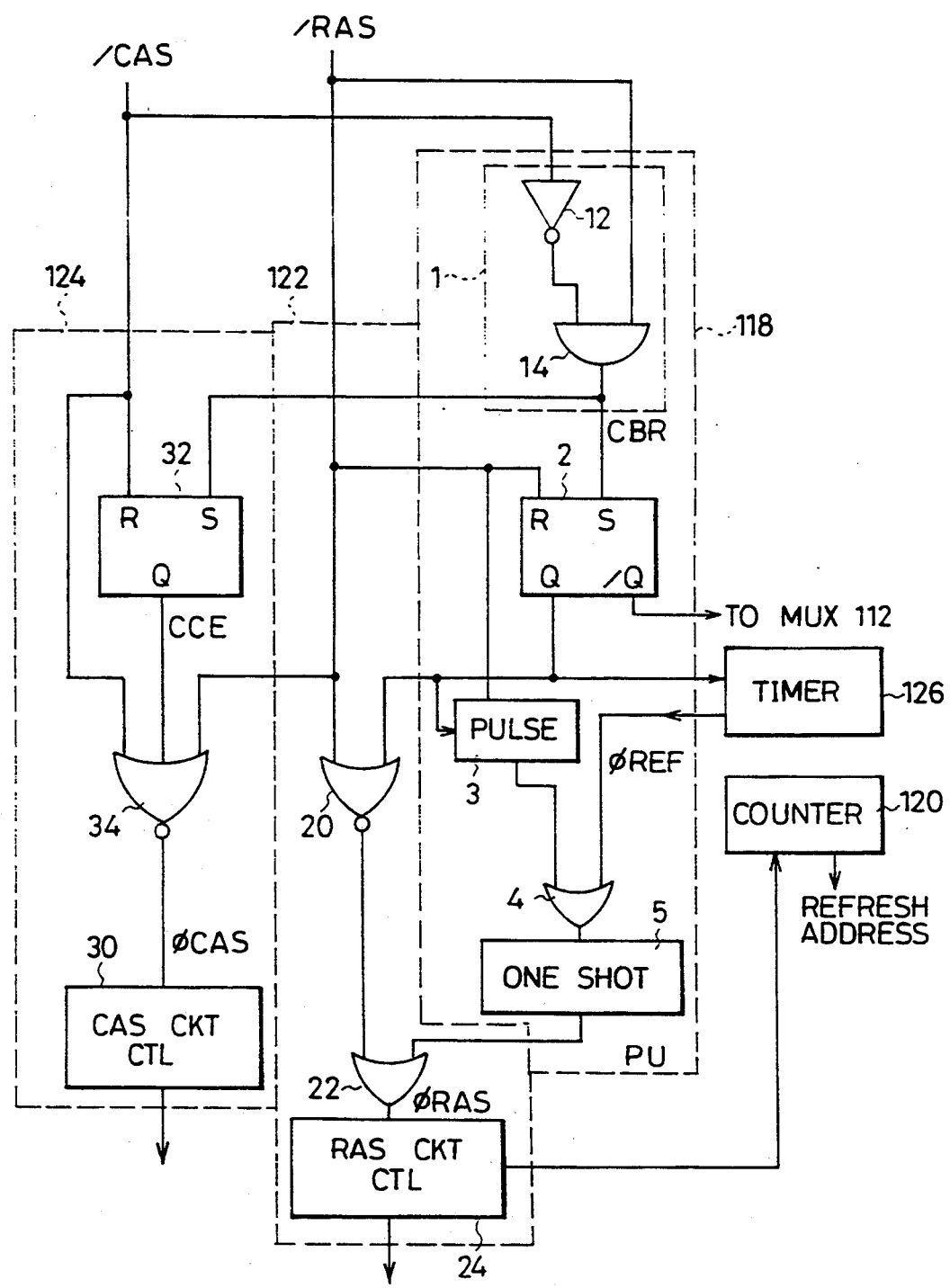
FIG. 12 schematically shows a circuit construction of a refreshing control circuitry in a dynamic type semiconductor memory device shown in FIG. 11.
Figure 13:
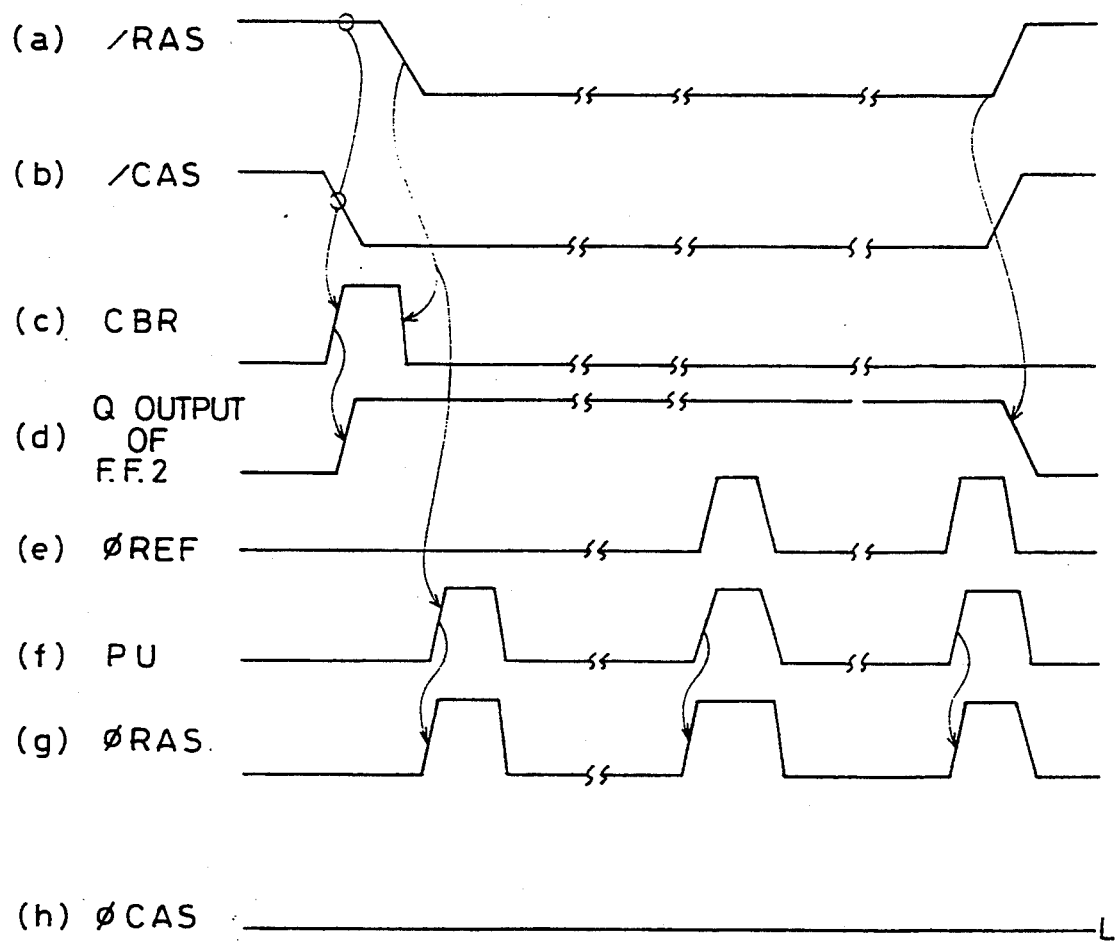
FIG. 13 is a signal waveform diagram showing an operation of a refreshing control circuitry shown in FIG. 12.
Figure 14:
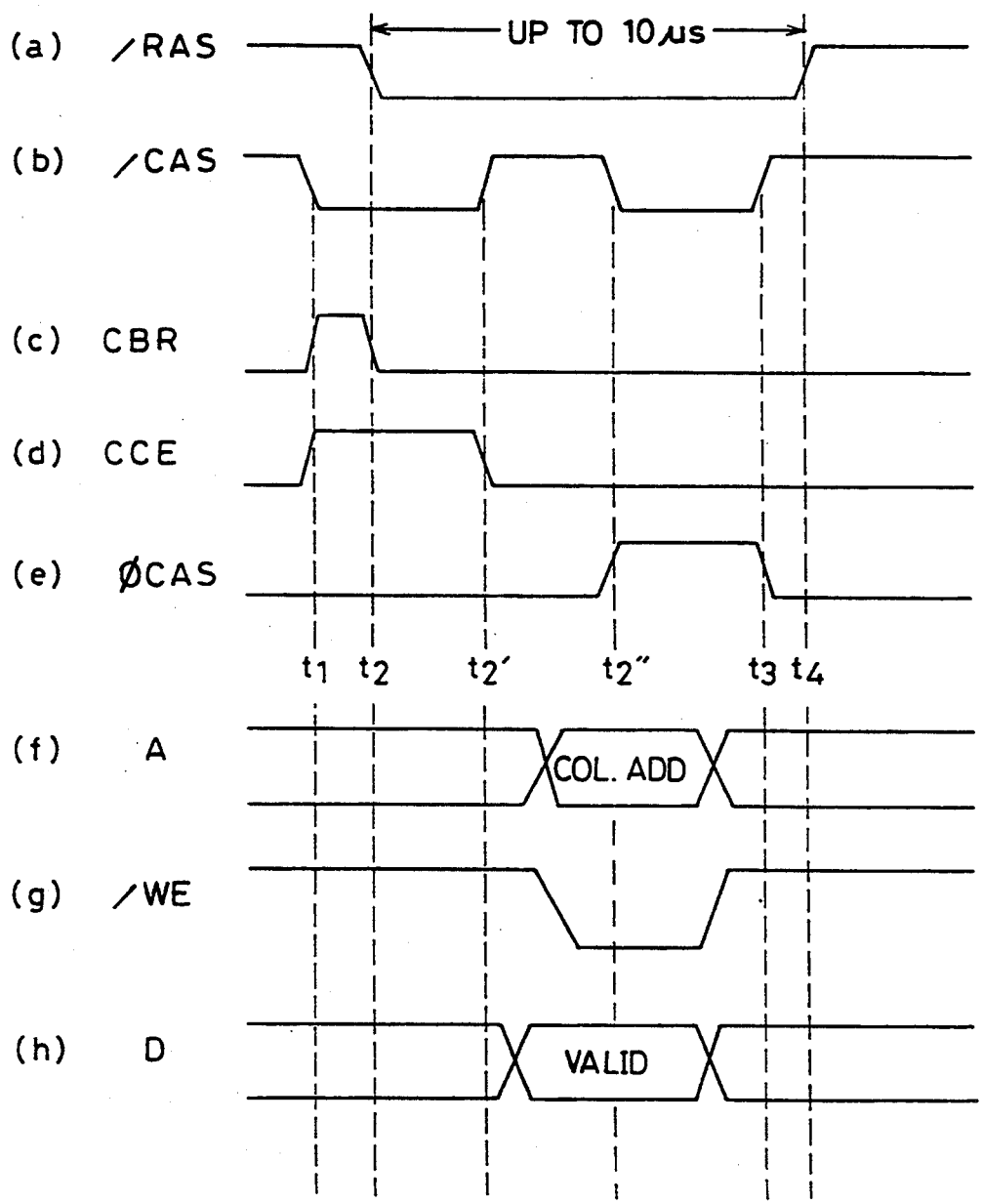
FIG. 14 is a signal waveform diagram showing a counter check operation in a dynamic type semiconductor memory device in the prior art.
Figure 15:
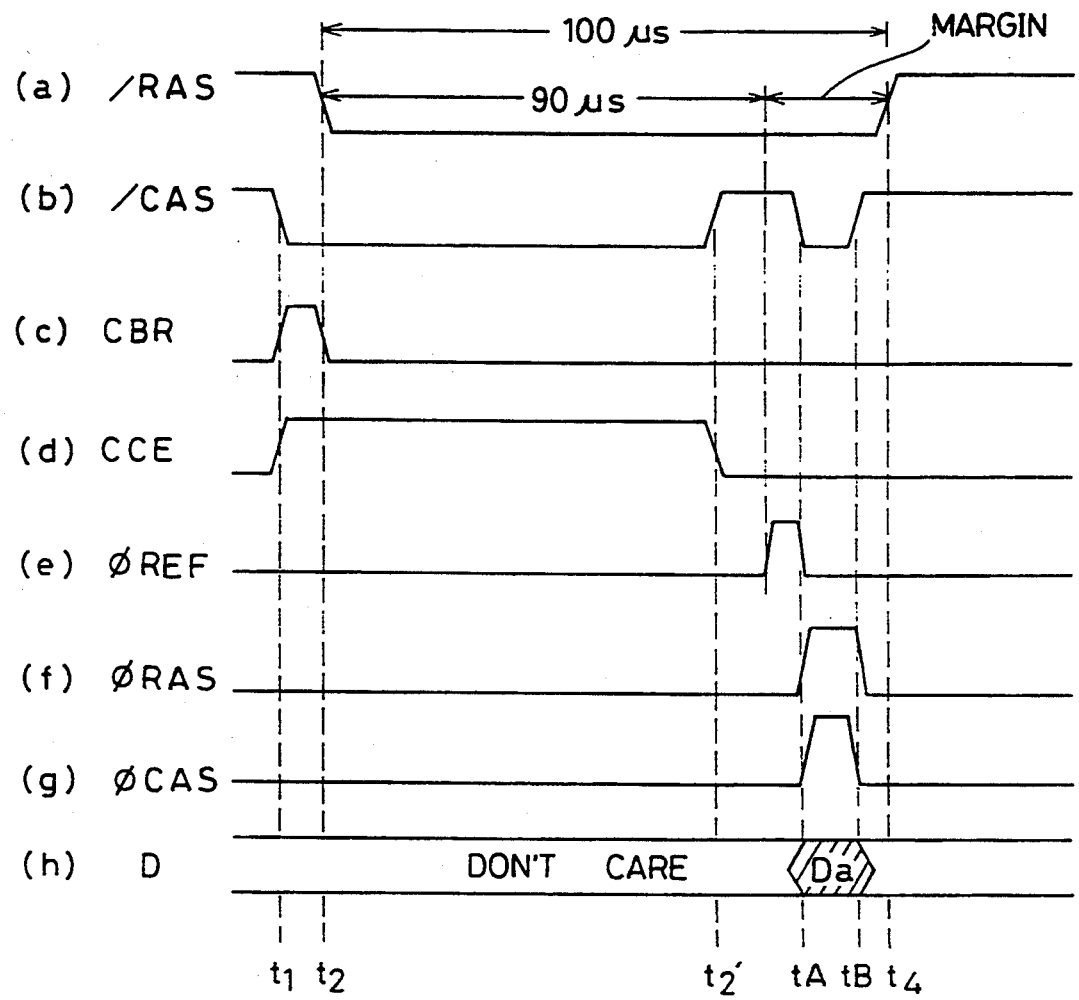
FIG. 15 is a signal waveform diagram for showing disadvantages in a conventional self-refreshing operation mode.

A gate circuit 372 receives Q output $\phi$L of RS flip-flop 370, the signal CCE from RS flip-flop 32 shown in FIG. 2A or in FIG. 12 and the signals /RAS and /CAS. Gate circuit 372 generates the internal CAS signal $\phi$CAS only when the signals $\phi$L, CCE, /RAS and /CAS are at "L". Now, operation of the arrangement of FIG. 8 will be described with reference to FIG. 9.

When CBR condition is met, the timer 126 is set, and the signal CCE rises to "H". In response to the fall of the signal /RAS, internal RAS signal $\phi$RAS is generated. RS flip-flop 370 is reset by the rising of the signal /RAS. While the internal RAS-signal $\phi$RAS is generated, a memory access can be carried out. While the internal RAS signal $\phi$RAS is at "L", no memory access can be made. The memory device is in a precharge state.

When the predetermined time has passed, the timer 126 generates the refresh request signal $\phi$REF at "H". Responsively, RS flip-flop 370 is set to raise the signal $\phi$L at Q output to "H". The internal CAS signal $\phi$CAS is fixed to "L", correspondingly. Therefore, even when the internal RAS signal $\phi$RAS is generated for refreshing, no CAS-related circuit operates. No destruction of memory cell data is caused during the self-refreshing. When the signal /RAS rises to "H", the internal CAS signal $\phi$CAS is fixed to "L". While the signal /RAS is at "L", the signal $\phi$L is maintained at "H". Under this condition, the signal /CAS may change or be toggled.

RS flip-flop 370 may be reset by the internal RAS signal $\phi$RAS falling to "L". While the signal $\phi$RAS is at "L", RAS-related circuits are in a precharge state, and no memory cell is connected to a bit line, and no memory cell data is destructed.

The refresh timer 126 is employed for controlling generation of the signal $\phi$CAS, the number of components can be reduced. The generation of the internal CAS signal $\phi$CAS can be also reliably prevented during the self-refreshing operation, even if the operating characteristics of the timer varies from a device to a device.

According to the invention, as described hereinbefore, in the self-refreshing operation, since the generation of the internal CAS signal is inhibited after the elapsing of a predetermined time period, the timing condition on the external column address strobe signal /CAS can be mitigated without impairing the counter check function and any malfunction in the self-refreshing operation mode can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operable in a self-refreshing mode and including a memory cell array including a plurality of dynamic type memory cells arranged in rows and columns, comprising:
   means for generating an internal refreshing instructing signal in response to a refreshing mode instructing signal;
   delay means for delaying a memory cycle start instructing signal by a predetermined time period in response to said internal refreshing instructing signal; and
   inhibition means for inhibiting writing of data in a memory cell in said memory cell array in response to an output of said delay means, said inhibition means allowing the writing of data for said predetermined time period.

2. A semiconductor memory device according to claim 1, wherein said predetermined time period is longer than a time required for selecting a memory cell in said array and reading or writing data to or from said selected memory cell.

3. A semiconductor memory device according to claim 1, wherein said means for inhibiting includes first means responsive to a column selection triggering signal for starting an operation of selecting a column of said memory cell array, for generating an internal column selection triggering signal, and second means responsive to the output of said delay means, for inhibiting said first means from generating said internal column selection triggering signal.

4. A semiconductor memory device according to claim 3, wherein said first and second means are combined into a gate means receiving said memory cycle start instructing signal, said output of said delay means, said internal refreshing mode instructing signal and said column selection triggering signal and performing a negative logical sum operation on received signals.

5. A semiconductor memory device according to claim 1, wherein said delay means includes means delaying only the transition of said memory cycle start instructing signal from an inactive state to an active state.

6. A semiconductor memory device according to claim 1, wherein said means for inhibiting includes means for inhibiting said writing only when said output of said delay means is in an active state.

7. A semiconductor memory device operable in a self-refreshing mode and including a memory cell array including a plurality of dynamic type memory cells arranged in rows and columns, comprising:

means for generating an internal refreshing instructing signal in response to a refreshing mode instructing signal;

delay means for delaying a memory cycle start instructing signal by a predetermined time period in response to said internal refreshing instructing signal; and means for inhibiting writing of data in a memory cell in said memory cell array in response to an output of said delay means, wherein said means for generating includes CBR detection means responsive to said memory cycle start instructing signal and a column selection triggering signal for starting an operation of selecting a column in said memory cell array, for detecting when said self-refreshing mode is designated, and latching means for latching an output of said CBR detecting means to generate said internal refreshing instructing signal when said CBR detecting means detects said self-refreshing mode.

8. A semiconductor memory device according to claim 7, wherein said latching means includes means responsive to said column selection triggering signal, for releasing a latching state of said latching means.

9. A semiconductor memory device according to claim 7, wherein said latching means comprises a flip-flop receiving said output of said CBR detection means at a set input and said column selection triggering signal at a reset input.

10. A semiconductor memory device according to claim 7, wherein said latching means is reset in responsive to the memory cycle start instructing signal.

11. A semiconductor memory device operable in a self-refreshing mode and including a memory cell array including a plurality of dynamic type memory cells arranged in rows and columns, comprising:

means for generating an internal refreshing instructing signal in response to a refreshing mode instructing signal;

delay means for delaying a memory cycle start instructing signal by a predetermined time period in response to said internal self-refreshing instructing signal and including pulse generation means responsive to said internal self-refreshing instructing signal and said memory cycle start instructing signal for generating a pulse signal of a predetermined pulse width, retarding means for retarding said pulse signal by a predetermined time period, and latch means for latching the pulse signal received through said retarding means; and means for inhibiting writing of data in a memory cell in said memory cell array in response to an output of said delay means.

12. A semiconductor means device according to claim 11, wherein said latch means includes means responsive to deactivation of said memory cycle start instructing signal, for releasing a latching state of said latch means.

13. A semiconductor memory device according to claim 11, wherein said latch means comprises a flip-flop having a set input receiving an output of said retarding means and a reset input receiving said memory cycle start instructing signal.

14. A semiconductor memory device operable in a self-refreshing mode and including a memory cell array including a plurality of dynamic type memory cells arranged in rows and columns, comprising:

means for generating an internal refreshing instructing signal in response to a refreshing mode instructing signal;

delay means for delaying a memory cycle start instructing signal by a predetermined time period in response to said internal refreshing instructing signal and including a timer responsive to the internal refreshing signal for generating a refresh request signal instructing the self-refreshing; and means for inhibiting writing of data in a memory cell in said memory cell array in response to an output of said delay means.

15. A semiconductor memory device operable in a self-refreshing mode and including a memory cell array including a plurality of dynamic type memory cells arranged in rows and columns, comprising:

means for generating an internal refreshing instructing signal in response to a refreshing mode instructing signal;

delay means for delaying a memory cycle start instructing signal by a predetermined time period in response to said internal refreshing instructing signal;

means for inhibiting writing of data in a memory cell in said memory cell array in response to an output of said delay means; and timer means for generating a refresh request when said memory cycle start instructing signal is maintained active for a predetermined specified time period after said internal refreshing instructing signal is generated, wherein said predetermined time period is shorter than said predeterminedly specified time period, but is longer than a cycle time required for refreshing data of memory cells.

16. A semiconductor memory device operable in a self-refreshing mode and having an address counter check function, comprising:

a memory cell array having a plurality of memory cells arranged in rows and columns;

means for generating a refresh instructing signal;

means responsive to said refresh instructing signal for inhibiting an operation of selecting a column in said array until after a predetermined time has passed since generation of said refresh instructing signal, said predetermined time being longer than the time required for a cycle in executing said address counter check.

17. A semiconductor memory device, comprising:

a memory cell array including a plurality of memory cells arranged in rows and columns;

means responsive to a refresh instructing signal for generating an internal refresh instructing signal;

column means responsive to a column selection start instruction signal for generating a control signal enabling an operation related to selection of a column in said array;

delay means for delaying a row selection start instructing signal by a predetermined time in response to said internal refresh instructing signal; and means responsive to an output of said delay means for placing said column means into a disabled state disabling said control signal independently of said column selection start instruction signal.

18. A method of operating a dynamic type semiconductor memory device operable in a self-refreshing mode and including a memory cell array including a plurality of dynamic type memory cells arranged in rows and columns, comprising the steps of:

detecting a refresh mode instruction in response to a combination of a first clock signal indicating a timing of strobing a row address signal and a second clock signal indicating a timing of strobing a column address signal;

generating an internal refresh mode signal in response to the refresh mode instruction;

delaying a transition to an activation of said first clock signal by a predetermined time period in response to said internal refresh mode instruction; and inhibiting generation of an internal column address strobing signal responsive to said second clock signal, in response to a delayed first clock signal provided by the step of delaying.

19. A method of operating a dynamic type semiconductor memory device according to the claim 18, further including the step of;

generating the internal column address strobing signal in response to an inactivation of said delayed first clock and said internal refresh mode signal and to an activation of said first and second clock signals.

20. A method of operating a semiconductor memory device including a memory cell array arranged in rows and columns, comprising the steps of:

generating an internal refresh instructing signal in response to a refresh instructing signal;

delaying a memory cycle start instructing signal by a predetermined time in response to said internal refresh instructing signal; and inhibiting at least writing of data in a memory cell in said array in response to the delayed memory cycle start instructing signal being active while allowing said at least writing of data for said predetermined time in response to said internal refresh instructing signal.

21. A method of operating a semiconductor memory device including a memory cell array including a plurality of memory cells arranged in rows and columns, and operable in response to a row address strobe signal and a column address strobe signal, comprising the steps of:

generating a refresh instructing signal in response to said row and column address strobe signals, delaying said row address strobe signal by a predetermined time in response to said refresh instructing signal; and disregarding said column address strobe signal in response to the delayed row address strobe signal.

* * * * *